United States Patent [19]

Goodwin-Johansson

[11] Patent Number: 4,896,059
[45] Date of Patent: Jan. 23, 1990

[54] CIRCUIT TO PERFORM VARIABLE THRESHOLD LOGIC

[75] Inventor: Scott Goodwin-Johansson, Pittsboro, N.C.

[73] Assignee: Microelectronics Center of North Carolina, Research Triangle Park, N.C.

[21] Appl. No.: 224,334

[22] Filed: Jul. 26, 1988

[51] Int. Cl.⁴ .............................................. H03K 17/30
[52] U.S. Cl. .................................... 307/464; 307/448; 307/451; 307/363
[58] Field of Search ............... 307/443, 448, 451, 464, 307/362–363, 364, 243, 585, 276 R

[56] References Cited

U.S. PATENT DOCUMENTS

| 3,609,329 | 9/1971 | Martin | 307/464 X |
| 3,646,329 | 2/1972 | Yoshino et al. | 307/464 |
| 3,715,603 | 2/1973 | Lerch | 307/464 |
| 3,916,215 | 10/1975 | Gaskill, Jr. et al. | 307/464 X |
| 4,091,293 | 5/1978 | Ando | 307/464 |
| 4,365,316 | 12/1982 | Iwahashi et al. | 307/296 R X |
| 4,423,339 | 12/1983 | Seelbach et al. | 307/464 |
| 4,682,055 | 7/1987 | Upadhyayula | 307/451 |

FOREIGN PATENT DOCUMENTS 1374910 11/1974 United Kingdom ................ 307/464

Primary Examiner—David Hudspeth
Attorney, Agent, or Firm—Bell, Seltzer, Park & Gibson

[57] ABSTRACT

A variable threshold logic detector with high switching speeds and small circuit size is disclosed. The device utilizes transistors of opposite semiconductor materials to provide a large change in voltage when a certain current threshold or number of inputs has been crossed. The number of inputs that may be accommodated and the current threshold are variable and each input may be individually weighted.

13 Claims, 3 Drawing Sheets

CIRCUIT TO PERFORM VARIABLE THRESHOLD LOGIC

BACKGROUND OF THE INVENTION

This invention relates generally to logic and programming devices and more particularly to a technique for improving threshold logic circuit speed without increasing circuit size. This is generally accomplished by a circuit having separate gate inputs for the transistors that comprise the circuit.

DESCRIPTION OF THE PRIOR ART

A threshold level detector circuit is employed in systems where it is necessary to generate a logic 1 or a logic 0 level dependent on whether there are at least a predetermined number of digital input signals at a logic 1, or one or more analog input signals is above or below some predetermined threshold voltage.

One type of threshold logic circuit is presented in U.S. Pat. No. 3,715,603 to Lerch, which discloses a first and second array of parallel transistor gates having a common input for both arrays. U.S. Pat. No. 3,433,978 to Bongenaar, et al describes a low output impedence majority logic inverting circuit. Bongenaar uses logic input signal terminals connected together in parallel to the emitters of the transistors. Also, the bases of these same transistors are connected together with the ground, and the collector of one transistor is connected to the base of the other transistor. U.S. Pat. No. 3,916,215 to Gaskill, Jr., et al describes a programmable logic gate having transistor pairs. The opposing transistors have their emitters connected together. A digital differential comparator indicates the ultimate logic state of that device. U.S. Pat. No. 3,378,695 to Marette discloses a logic circuit utilizing parallel transistor pairs and a multiple emitter transistor. Inputs are connected to the bases of the two transistors. None of these references disclose a logic circuit having separate gate inputs for separate transistor means or arrays that comprise the circuit, and using these separate inputs to vary the threshold reference level. Applicant specifically intends to incorporate by reference all patents mentioned herein.

There is a need for a threshold logic detector which employs a variable threshold reference that is determined, for example, through a predetermined circuit operating point that may be altered or set by the different biases or voltages applied to the gates in a first array of parallel transistors. It would be a further advantage to the art and to the industry if threshold logic detectors could be made faster and accommodate weighted inputs while not unduly increasing the size of the circuit.

SUMMARY OF THE INVENTION

A threshold memory device is disclosed which is bi-stable and switches from a low output to a high output when a minimum level or number of inputs are received. The number of inputs that may be accommodated is variable, each input may be individually weighted, and the threshold level at which the device switches states is variable. The circuit includes a known source of reference voltage. A first transistor means or transistor array of a first semiconductor type has its source(s) connected to the reference voltage and drain(s) connected to a common circuit point. The transistor gate(s) is also connected to the reference voltage. A second array of parallel transistors of a second semiconductor type is complementary to the first transistor means or array. The second array transistors have the drains connected to the common circuit point, the sources connected to ground, and gates adapted to receive input signals to be monitored.

It is an object of the present invention to provide a threshold logic circuit which improves switching speed in threshold logic detectors.

Another object of the invention is to improve switching speed in threshold logic detectors while not increasing the size of the circuit.

Another object of the invention is to provide a threshold logic detector where a very slight change in the current results in an exaggerated change in voltage.

Another object of the invention is to provide a threshold logic detector having a variable threshold reference voltage or number of inputs that is determined by the number of gates tied to ground in a first array of two parallel arrays.

A further object of the invention is to provide a threshold logic detector circuit that may accommodate weighted input signal sources for the gates of a second array of two parallel arrays.

Other objects and advantages will become apparent upon reading the following description and appended claims, and upon reference to the accompanying drawings.

BRIEF DESCRIPTION OF THE DRAWINGS

Similar reference characters identify similar components in the various figures.

DETAILED DESCRIPTION OF THE INVENTION

The present invention uses the complementary output characteristics (current versus voltage) of transistors of different semiconductor types in a novel logic gate circuit. For example, an increase in the gate voltage applied to an NMOS transistor increases the drain current, but an increase in the gate voltage applied to a PMOS transistor decreases the drain current. By matching these complementary characteristics, one may increase the speed of the gate and have variable threshold capabilities.

Figure 1:
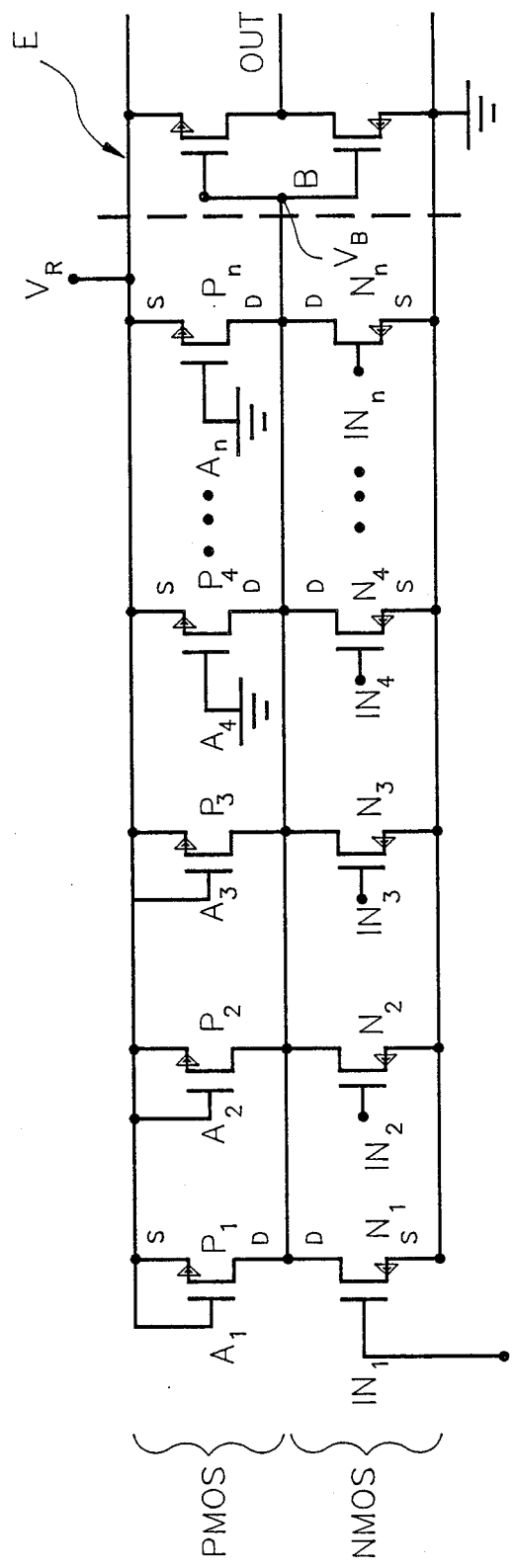
FIG. 1 is a schematic drawing of the threshold logic detector of the present invention.

FIG. 1 illustrates a circuit embodying these principles. A parallel array of PMOS transistors $P_1, P_2 \ldots P_n$ each has its source attached to a known source of reference voltage $V_R$, such as a power supply. The drain D for each of the PMOS transistors is connected to a common circuit point B.

The gates $A_1, A_2 \ldots A_n$ of the PMOS transistors are used to set a reference voltage for common circuit point B, which can be varied as necessary or desirable. A predetermined number of first array gates, such as $A_1$, $A_2$ and $A_3$ are connected to $V_R$, and the remaining first array gates $A_4 \ldots A_n$ are connected to ground. Thus, the total current flow through the first array transistors increases as more first array gates are connected to ground. The voltage at circuit point B varies as a function of the amount of current flowing through the first array transistors and as a function of how many NMOS transistors are turned on.

A second parallel array of transistors of a second semiconductor type, such as NMOS transistors $N_1, N_2, N_3 \ldots N_n$, is complementary to the first array of parallel transistors. There is one transistor in the second array for each transistor in the first array. In order to weight an input the widths of a transistor PMOS-NMOS pair corresponding to that input are widened or narrowed compared to the other transistor pairs. In addition, it is desirable to adjust the relative widths of each PMOS-NMOS pair to account for mobility difference and to yield roughly equal currents in each.

Each second array transistor has its source connected to ground. The drain of each of the second array transistors is connected to the common circuit point B. The gates $IN_1, IN_2 \ldots IN_n$ of each of the NMOS transistors are adapted to receive the various logic input signals for the circuit.

The portion of FIG. 1 to the right of the dotted line illustrates a bi-stable inverter circuit E having an input connected to circuit point B and an output labeled OUT. Such bi-stable inverters are well known in the industry and toggle from one state to the other as the input at circuit point B goes above or below a predetermined threshold which is the switching point. The invertor shown is a high gain sense amplifier which is used to amplify the slight changes at the input into large output changes. Assuming that the threshold for the bi-stable inverter is fixed, the threshold level at which the logic circuit changes states may effectively be changed by altering the number of first array transistor gates $A_1, A_2$, etc. that are connected to ground. If some or all of the reference transistors are merged (losing some or all of the programmability) power and space can be conserved by reversing the roles of the PMOS and NMOS transistors, using the PMOS gates for inputs and the NMOS gates for setting a reference.

Figure 2:
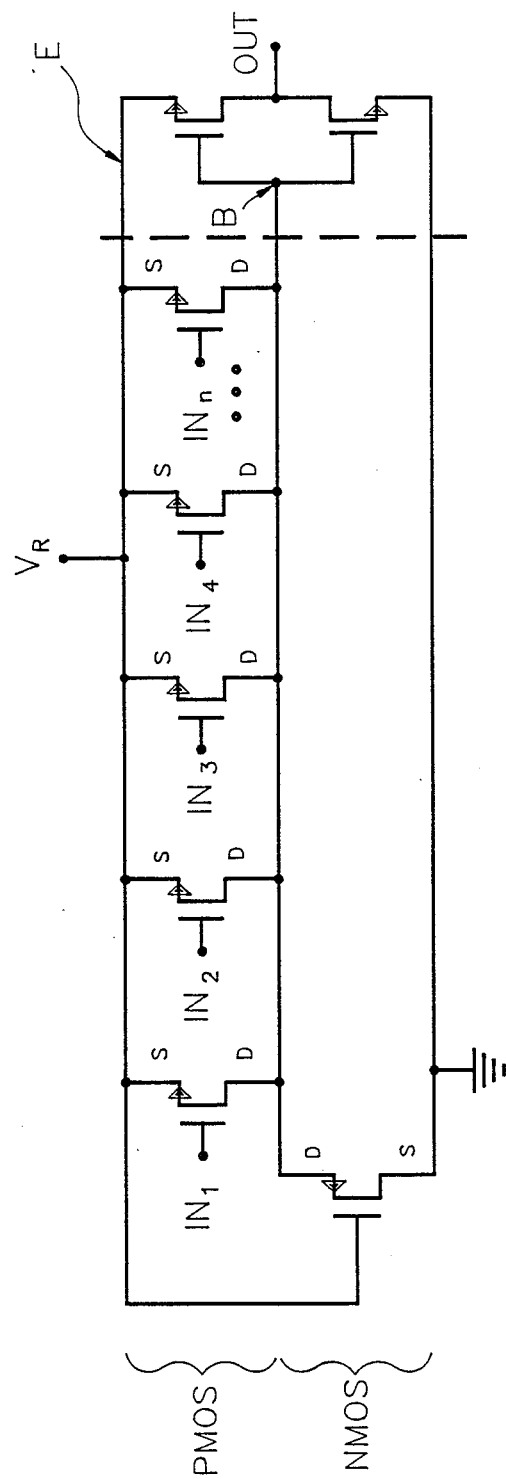
FIG. 2 is a schematic drawing of an alternate embodiment of the threshold logic detector of the present invention.

FIG. 2 illustrates an alternate embodiment of the circuit illustrated in FIG. 1. A single NMOS transistor has its source connected to the ground and drain connected to a common circuit point B. The gate is connected to the reference voltage. Substitution of a single transistor for the first array shown in FIG. 1 increases density but prevents post-fabrication alteration of the logic levels or reference setting with fusible links or other logic circuits. The second array of parallel transistors is virtually identical in structure and function to that illustrated in FIG. 1, with the substitution of PMOS for NMOS transistors. Note that placement of NMOS or PMOS type transistors are equivalent but which gates are inputs and which gates are references are switched and first array NMOS sources are connected to ground and drains to the common circuit point and second array PMOS sources connected to the reference voltage and drains to the common circuit point.

Figure 3:
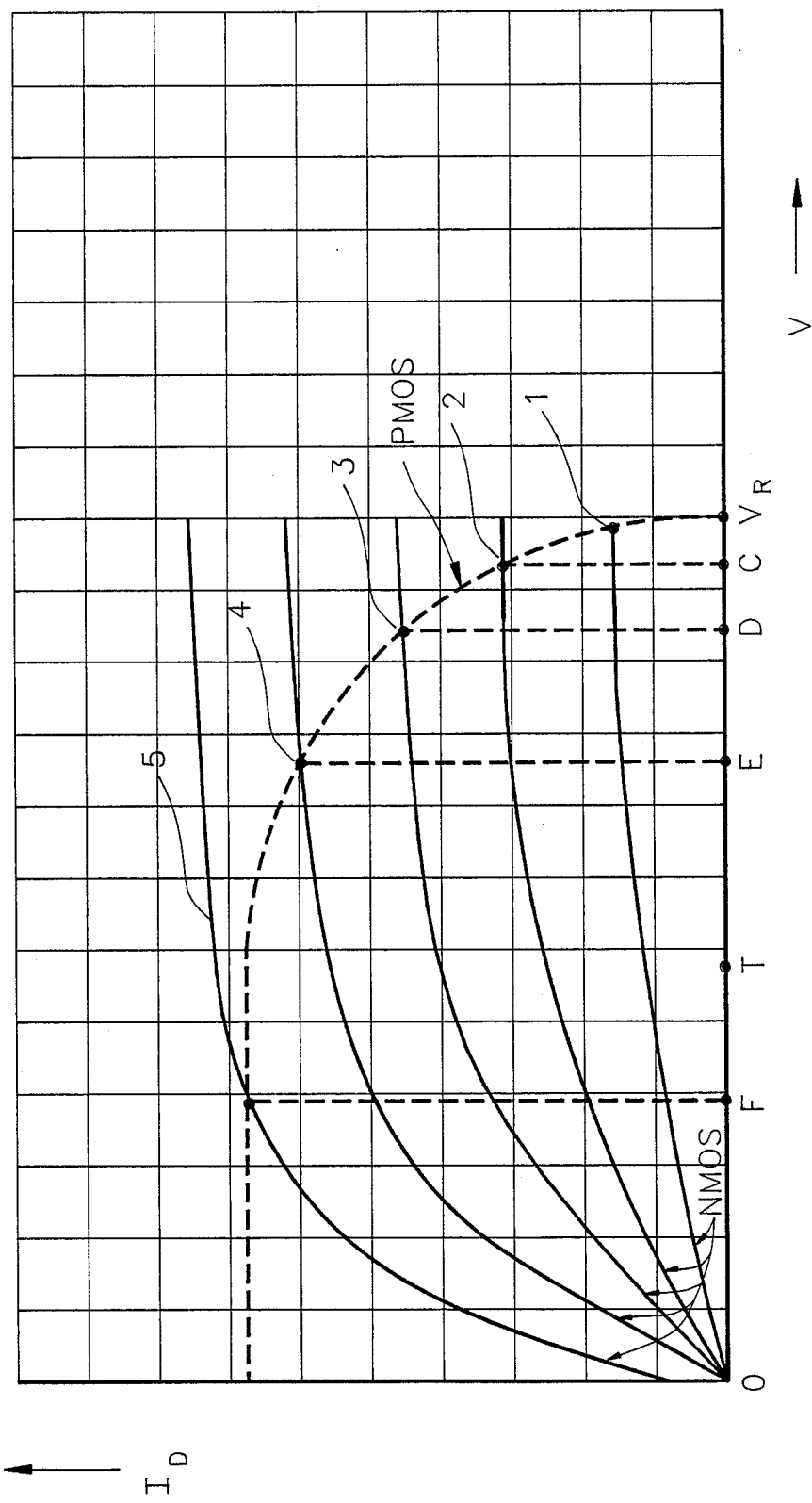
FIG. 3 shows the load curves (current versus voltage) for the circuit with the output characteristics for an NMOS transistor in solid lines and a PMOS transistor in dotted lines.

Referring to FIG. 3 the typical output characteristics (current versus voltage $V_B$) for different numbers of NMOS transistors connected in parallel are in solid lines and the typical output characteristics for a PMOS transistor are in dotted lines. As the drain voltage in an NMOS transistor increases the drain current also increases until the device is saturated, meaning that a further increase in the input drain voltage no longer results in an appreciable change in drain current. This is represented by the relatively horizontal portions of the solid curve at higher values of $V_B$. However, the opposite is true for the PMOS transistors. The drain current increases as the voltage $V_B$ decreases until the device reaches saturation, at which time the current curve is also relatively horizontal. The present invention uses the complementary characteristics of these NMOS and PMOS transistors. A voltage and current level are defined (i.e. an "operating point") so that they occupy a portion of the graph where the NMOS and PMOS transistors each are conducting the same amount of current. This is shown graphically by the intersection of the NMOS (solid line) characteristic and the PMOS (dotted line) characteristic. For instance, the current conducted by all of the conducting PMOS transistors (transistors $P_4$ through $P_N$ in FIG. 1) is represented by the single PMOS dotted curve. The current conducted by the NMOS transistors increases as the number of high input signals to the NMOS gates increases, rendering more of the NMOS transistors conductive. Curve 2 represents the voltage and current characteristics if two NMOS transistors are conducting, resulting in a voltage C at circuit point B. Curve 4 represents the voltage and current characteristics if four NMOS transistors are conducting, resulting in a voltage E at circuit point B. Thus, for a very slight change in current, such as the increase from four to five conducting NMOS transistors, there is an exaggerated change in voltage $V_B$ as the operating point moves from E to F, at which point the output of the circuit toggles as the voltage $V_B$ shifts from E to F.

In operation, referring to FIGS. 1 and 3, a predetermined number of first array PMOS gates $A_1, A_2 \ldots A_n$ are connected to the reference voltage $V_R$ (i.e. power supply) or ground to establish the PMOS part of the curve and hence operating points on the load curves for different inputs to the second transistor array, such as point E in FIG. 3. This establishes the threshold of the circuit.

The voltage $V_B$ measured from the circuit point B to ground is highest when all of the NMOS gate inputs are low. As the NMOS gate inputs go high, or a voltage is applied thereto, the NMOS transistors are turned on or rendered conductive. The number of high inputs applied to the gates of the NMOS transistors determines the amount of current that can be sunk by the NMOS transistors. To balance that current flow with what is being sourced by the PMOS transistors, the voltage at circuit point B will vary. Ideally, the current conducted through one PMOS transistor will approximately equal the current conducted through one NMOS transistor. As the current through the NMOS transistors increases the voltage $V_B$ decreases. When the switching point voltage T is set between two operating points E and F and one more NMOS transistor is turned on, the voltage $V_B$ shifts from E to F past the point T, which toggles the final inverter. For maximum sensitivity, the PMOS and NMOS transistors are selected so that both transistors are in saturation at the switching point.

In order to increase the number of inputs to a single threshold gate and maintain good sensitivity, the load curves in FIG. 3 should be as flat as possible (i.e. have a low output conductance). One way to accomplish this is to increase the length of the transistor channels. Another way is to reduce the amount that the gate voltage is driven above the threshold voltage. This can be done by adjusting the input logic levels and the voltages applied to the gates of the first array of transistors or by changing the reference voltage of the threshold gate.

To further control the amount of current passed by the first array of transistors, the voltage applied to those gates can be controlled by an on-chip feedback circuit which balances the current passed by the NMOS and PMOS transistors.

It is pointed out that although the present invention is shown and described with reference to particular embodiments, nevertheless various changes and modifications obvious to one skilled in the art to which the invention pertains are deemed to lie within the scope of the invention.

That which is claimed is:

1. A high speed logic gate circuit for detecting input signals and having variable threshold capabilities comprising:
   a. a source of reference voltage;
   b. at least one first transistor means of a first gate conductivity type having the transistor source connected to reference voltage and the transistor drain connected to a common circuit point and the gate of the transistor means connected to said reference voltage or ground with at least one gate connected to said reference voltage if the first gate conductivity type is NMOS and at least one gate connected to the ground if the first gate conductivity type is PMOS to establish a predetermined circuit operating point;
   c. an array of parallel transistors of a second gate conductivity type, complementary to said first transistor means and having the array transistor drains connected to the common circuit point and the array transistor sources connected to the ground and gates of selected array transistors coupled for receiving signals to be monitored; and
   d. bi-stable inverter means having its input connected to said common circuit point so that its output changes state when the voltage at said common point exceeds a predetermined level.

2. A circuit described in claim 1 wherein the first transistor means is formed of the NMOS type transistors and the array of parallel transistors is formed of PMOS type transistors with at least one NMOS gate connected to said reference voltage.

3. A circuit as described in claim 1 wherein each transistor means of a selected complementary pair of a transistor means of a first gate conductivity type and a transistor means of a second gate conductivity type conducts similar amounts of current.

4. A circuit as described in claim 1 wherein inputs are weighted by adapting the first transistor means to include a conduction channel of a certain width being adapted to conduct an amount of current substantially similar to the amount of current passed by at least one of the transistors of the array of parallel transistors.

5. A circuit as described in claim 1 wherein inputs are weighted by adapting one or more of the transistors of the array of parallel transistors to include a conduction channel of a certain width being adapted to conduct an amount of current substantially similar to the amount of current passed by the first transistor means.

6. A high speed logic gate circuit for detecting input signals and having variable threshold capabilities comprising:
   a. a source of reference voltage;
   b. at least one first PMOS type transistor means having the transistor source connected to the reference voltage and the transistor drain connected to a common circuit point and the gate of the transistor means connected to said reference voltage or ground with at least one gate connected to ground to establish a predetermined circuit operating point;
   c. an array of NMOS type parallel transistors complementary to said first transistor means and having the array transistor drains connected to the common circuit point and the array transistor sources connected to ground and gates of selected array transistors coupled for receiving input signals to be monitored; and
   d. bi-stable inverter means having its input connected to said common circuit point so that its output changes state when the voltage at said common circuit point exceeds a predetermined level.

7. A high speed logic gate circuit for detecting input signals and having variable threshold capabilities comprising:
   a. a source of reference voltage;
   b. a first array of parallel transistors of a first gate conductivity type having the transistor sources connected to the reference voltage and the transistor drains connected to a common circuit point and gates of selected transistors connected to said reference voltage or ground with at least one gate connected to said reference voltage if the first gate conductivity type is NMOS and at least one gate connected to ground if the first gate conductivity type is PMOS to establish a predetermined circuit operating point;
   c. a second array of parallel transistors of a second gate conductivity type, complementary to said first array with one transistor for each transistor of the first array, and having the second array transistor drains connected to the common circuit point and the second transistor sources connected to ground and gates of second selected transistors coupled for receiving signals to be monitored; and
   d. bi-stable inverter means having its input connected to said common circuit point so that its output changes state when the voltage at said common point exceeds a predetermined level.

8. A circuit as described in claim 7 wherein the first array of parallel transistors is of PMOS type transistors and the second array of parallel transistors is formed of NMOS type transistors.

9. A circuit as described in claim 7 wherein gates of selected first array transistors are connected to said reference voltage and gates of non-selected first array transistors are connected to ground to determine the number of first array transistors with current flowing through them and thereby determine the threshold level.

10. A circuit as described in claim 7 wherein each transistor means of a selected complementary pair of a transistor means of a first gate conductivity type and a transistor means of a second gate conductivity type conducts similar amounts of current.

11. A circuit as described in claim 7 wherein inputs are weighted by adapting a transistor of the first transistor array to include a conduction channel of a certain width being adapted to conduct an amount of current substantially similar to the amount of current passed by one of the transistors of the second array of parallel transistors.

12. A circuit as described in claim 7 wherein inputs are weighted by adapting one or more of the transistors of the array of parallel transistors to include a conduction channel of a certain width being adapted to conduct an amount of current substantially similar to the amount of current passed by the first transistor means.

13. A high speed logic gate circuit for detecting input signals and having variable threshold capabilities comprising:
   a. a source of reference voltage;
   b. a first array of NMOS type parallel transistors having the transistor sources connected to ground and the transistor drains connected to a common circuit point and gates of selected transistors connected to said reference voltage or ground to establish a predetermined circuit operating point, with at least one gate connected to said reference voltage;
   c. a second array of PMOS type parallel transistors' complementary to said first array with one transistor for each transistor of the first array, and having the second array transistor drains connected to the common circuit point and the second transistor sources connected to the reference voltage and gates of selected second transistors coupled for receiving signals to be monitored; and
   d. bi-stable inverter means having its input connected to said common circuit point so that its output changes state when the voltage at said common circuit point exceeds a predetermined level.

* * * * *